(12) United States Patent
Chang et al.

(10) Patent No.: US 9,872,400 B2
(45) Date of Patent: Jan. 16, 2018

(54) TOUCH PANEL AND METHOD FOR MANUFACTURING THE SAME

(71) Applicant: TPK Touch Systems (Xiamen) Inc., Xiamen (CN)

(72) Inventors: Chen-Hsin Chang, Taoyuan (TW); Che-I Wu, Hsinchu (TW); Zhihong Ke, Xianyou (CN); Lixian Chen, Xiamen (CN); Wenzhi Qian, Quanzhou (CN)

(73) Assignee: TPK Touch Systems (XIAMEN) Inc, Xiamen (CN)

( * ) Notice: Subject to any disclaimer, the term of this patent is extended or adjusted under 35 U.S.C. 154(b) by 288 days.

(21) Appl. No.: 14/525,166

(22) Filed: Oct. 27, 2014

(65) Prior Publication Data

US 2015/0114815 A1   Apr. 30, 2015

(30) Foreign Application Priority Data

Oct. 26, 2013  (CN) .......................... 2013 1 0521044

(51) Int. Cl.
| | |
|---|---|
| *H05K 3/46* | (2006.01) |
| *G06F 3/044* | (2006.01) |
| *H03K 17/96* | (2006.01) |
| *H05K 1/02* | (2006.01) |
| *H05K 3/28* | (2006.01) |

(52) U.S. Cl.
CPC ............. *H05K 3/46* (2013.01); *G06F 3/044* (2013.01); *H03K 17/9622* (2013.01); *H05K 1/0274* (2013.01); *G06F 2203/04103* (2013.01); *H03K 2217/96015* (2013.01); *H03K 2217/960755* (2013.01); *H05K 3/28* (2013.01); *H05K 2201/09972* (2013.01)

(58) Field of Classification Search
None
See application file for complete search history.

(56) References Cited

U.S. PATENT DOCUMENTS

| | | | |
|---|---|---|---|
| 8,730,415 B2* | 5/2014 | Omote | .................... G06F 3/044 345/173 |
| 9,152,280 B2* | 10/2015 | Lee | ......................... G06F 3/044 |
| 2005/0243232 A1* | 11/2005 | Park | ...................... G02F 1/1362 349/43 |

(Continued)

*Primary Examiner* — Kent Chang
*Assistant Examiner* — Nathan Brittingham
(74) *Attorney, Agent, or Firm* — Paul David Bendemire

(57) ABSTRACT

The present disclosure provides a touch panel, including a substrate, at least one sensing electrode layer, a wire layer, a first light-shielding layer and a second light-shielding layer. The substrate has a visible region and a non-visible region. The wire layer corresponds to the non-visible region, wherein the wire layer includes signal lines and at least one gap therebetween, the signal lines electrically connect the sensing electrode layer. The first light-shielding layer is disposed within the non-visible region and between the substrate and the wire layer, wherein the first light-shielding layer includes at least one recess and a position of the recess corresponds to a position of the gap. The second light-shielding layer corresponds to the recess, wherein an area covered by the second light-shielding layer is equal to or greater than an aperture of the recess. The present disclosure also provides a method for manufacturing a touch panel.

9 Claims, 8 Drawing Sheets

(56) References Cited

U.S. PATENT DOCUMENTS

| | | | |
|---|---|---|---|
| 2008/0192186 A1* | 8/2008 | Nakagawa | G02F 1/1339 349/106 |
| 2011/0228193 A1* | 9/2011 | Shin | G02F 1/133606 349/61 |
| 2012/0075838 A1* | 3/2012 | Lee | G02F 1/133308 362/97.1 |
| 2012/0229736 A1* | 9/2012 | Osaki | G02F 1/133512 349/96 |
| 2013/0135241 A1* | 5/2013 | Wu | G06F 3/041 345/173 |
| 2013/0141380 A1* | 6/2013 | Wang | G06F 3/041 345/173 |
| 2013/0162596 A1* | 6/2013 | Kono | G06F 3/044 345/174 |
| 2013/0177841 A1* | 7/2013 | Sakai | G03F 1/50 430/5 |
| 2013/0241857 A1* | 9/2013 | Chung | G06F 3/044 345/173 |
| 2014/0131069 A1* | 5/2014 | Chang | H05K 3/40 174/251 |
| 2014/0340364 A1* | 11/2014 | Tang | G06F 3/042 345/175 |
| 2014/0368755 A1* | 12/2014 | Chen | G06F 3/044 349/12 |
| 2015/0114815 A1* | 4/2015 | Chang | H05K 3/46 200/5 R |

* cited by examiner

US 9,872,400 B2

TOUCH PANEL AND METHOD FOR MANUFACTURING THE SAME

BACKGROUND OF THE INVENTION

This application claims priority of China Patent Application No. 201310521044.4, filed on Oct. 26, 2013, the entirety of which is incorporated by reference herein.

Technical Field

The disclosure relates to a touch panel and a method for manufacturing the same, and in particular to a touch panel having multiple light-shielding layers and a method for manufacturing the same.

Description of the Related Art

In recent years, touch-sensing technology has gradually become the main input manner widely applied in various electronic products such as smart phones, Tablet PCs, or notebook computers. These touch devices usually utilize touch panels having a substrate and elements formed on the substrate, such as sensing electrode, black light shielding layer and touch signal line. Since the touch signal line is usually made of opaque materials, the black light shielding layer is formed before the touch signal line so as to shield the touch signal line.

Generally, the forming of the touch signal line utilizes etching processes. However, the etching processes, in particular laser etching processes, usually etch a portion of the black light shielding layer at the same time and result in the malfunction of the black light shielding layer, which in turn results in issues such as light leakage or exposure of the touch signal line.

SUMMARY OF THE INVENTION

Therefore, the present disclosure provides a touch panel and a method for manufacturing the same, which can effectively solve the light-leakage issue or the exposure of the touch signal line issue that result from a malfunction of the black light shielding layer.

The present disclosure provides a touch panel, including a substrate, at least one sensing layer, a wire layer, a first light-shielding layer and a second light-shielding layer. The substrate has a visible region and a non-visible region disposed at at least one side of the visible region. The sensing electrode layer is disposed over the visible region. The wire layer corresponds to the non-visible region, wherein the wire layer includes a plurality of signal lines and at least one gap therebetween, and the signal lines electrically connect the sensing electrode layer. The first light-shielding layer is disposed within the non-visible region and between the substrate and the wire layer, wherein the first light-shielding layer includes at least one recess and a position of the recess corresponds to a position of the gap. And the second light-shielding layer corresponds to the recess, wherein an area covered by the second light-shielding layer is equal to or greater than an aperture of the recess.

The present disclosure also provides a method for manufacturing a touch panel, including: providing a substrate having a visible region and a non-visible region disposed at at least one side of the visible region; forming at least one sensing electrode layer over the visible region. Forming a predetermined wire layer corresponding to the non-visible region. Forming a predetermined first light-shielding layer within the non-visible region and between the substrate and the wire layer. Etching the predetermined wire layer to form a wire layer, wherein the wire layer includes a plurality of signal lines and at least one gap therebetween, and the signal lines electrically connect the sensing electrode layer, wherein the etching of the predetermined wire layer also etches the predetermined first light-shielding layer to form a first light-shielding layer including at least one recess, wherein a position of the recess corresponds to a position of the gap. And forming a second light-shielding layer corresponding to the recess, wherein an area covered by the second light-shielding layer is equal to or greater than an aperture of the recess.

The touch panel and the method for manufacturing the same provided in the present disclosure form a second light-shielding layer after the etching process to fill the recess formed in the first light-shielding layer in the etching process, which in turn can effectively solve the issues of light leakage at the non-visible region and the exposure of the touch signal line.

A detailed description is given in the following embodiments with reference to the accompanying drawings.

BRIEF DESCRIPTION OF THE DRAWINGS

The disclosure may be more fully understood by reading the subsequent detailed description and examples with references made to the accompanying drawings, wherein:

FIGS. 2 and 4 are cross-sectional views of a touch panel of FIG. 1 at various manufacturing stages in accordance with other embodiments of the present disclosure;

DETAILED DESCRIPTION OF THE DISCLOSURE

Figure 1:
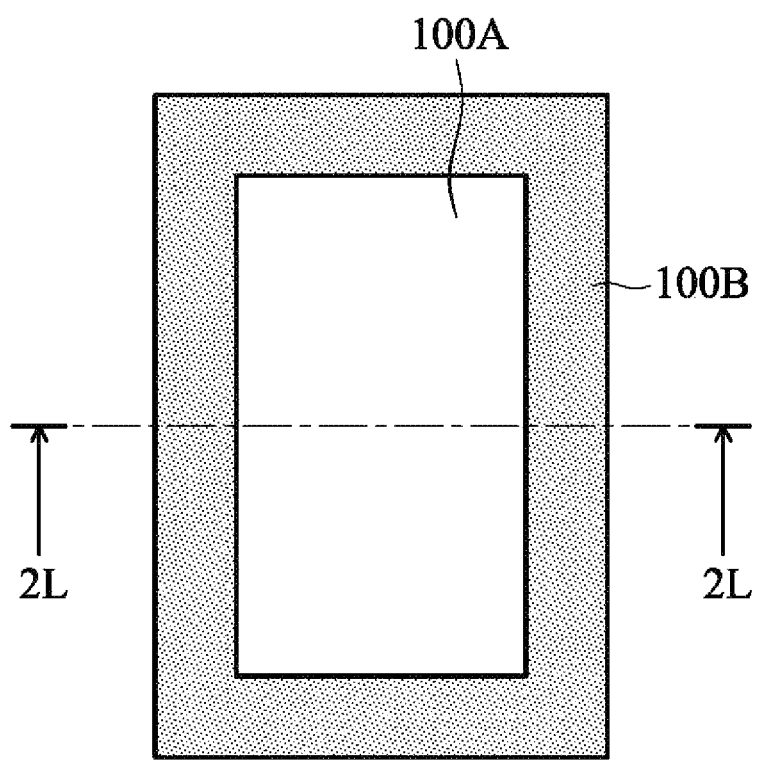
FIG. 1 is a top schematic view of a touch panel in accordance with embodiments of the present disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

In this specification, expressions such as "overlying the substrate", "above the layer", or "on the film" simply denote a relative positional relationship with respect to the surface of a base layer, regardless of the existence of intermediate layers. Accordingly, these expressions may indicate not only the direct contact of layers, but also, a non-contact state of one or more laminated layers. It is noted that in the accompanying drawings, like and/or corresponding elements are denoted to by like reference numerals.

The terms "about" and "substantially" typically means +/−20% of the stated value, more typically +/−10% of the stated value and even more typically +/−5% of the stated value. The stated value of the present disclosure is an approximate value. When there is no specific description, the stated value includes the meaning of "about" or "substantially".

Figure 2:
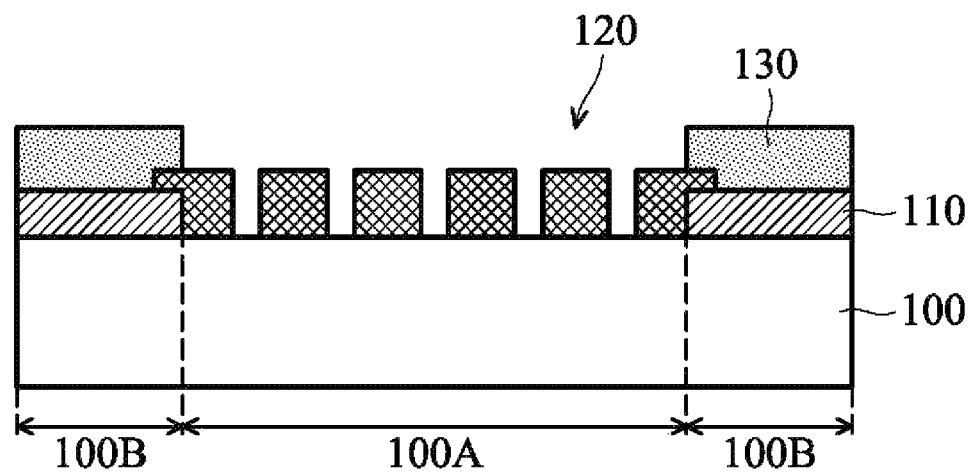
FIGS. 2-3 are cross-sectional views of a touch panel of FIG. 1 at various manufacturing stages in accordance with embodiments of the present disclosure.
Figure 3:
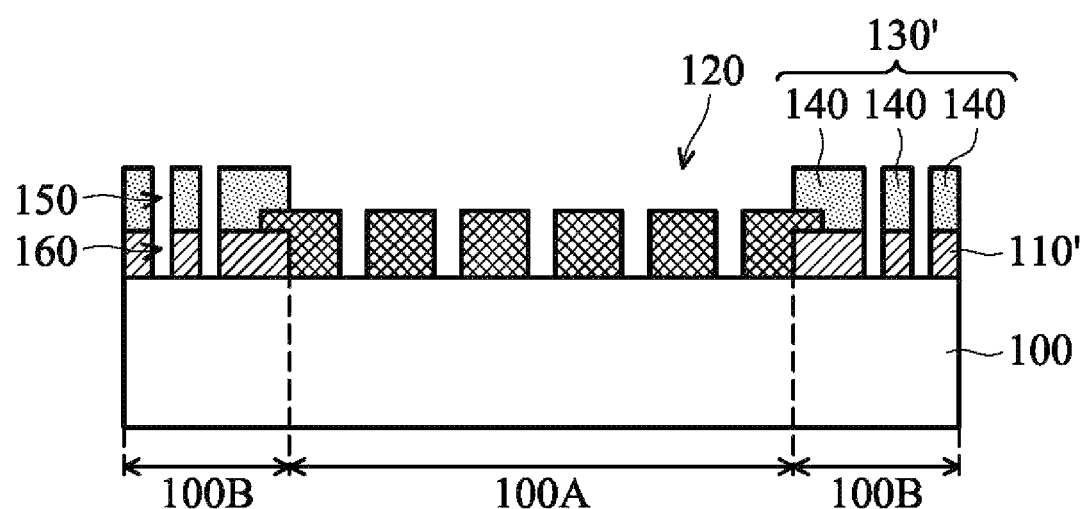

Referring to FIGS. 1-3, FIG. 1 is a top schematic view of a touch panel in accordance with embodiments of the present disclosure, and FIGS. 2-3 are cross-sectional views of a touch panel of FIG. 1 at various manufacturing stages in accordance with embodiments of the present disclosure. First, a substrate 100 is provided. The substrate 100 has a visible region 100A and a non-visible region 100B disposed at at least one side of the visible region 100A. In one embodiment of the present disclosure, the central region of the substrate 100 is the visible region 100A, and the non-visible region 100B is disposed around the visible region 100A. However, the location and the amount of the visible region 100A may be altered according to design requirements. For example, the location and the amount of the visible region 100A may be altered according to the location of the wire layer. The substrate 100 can be a transparent tempered glass substrate, a plastic substrate or any other suitable substrates. In some embodiments, the substrate 100 can be the cover lens of the touch panel. Moreover, the substrate 100 can also protect and support other elements.

FIG. 2 is a cross-sectional view along line 2L-2L of FIG. 1. As illustrated in the figure, the predetermined first light-shielding layer 110, the sensing electrode layer 120 and the predetermined wire layer 130 are formed sequentially over the substrate 100.

The predetermined first light-shielding layer 110 formed first in FIG. 2 corresponds to the non-visible region 100B and is disposed within the non-visible region 100B and between the substrate 100 and the wire layer 130. The predetermined first light-shielding layer 110 is made of black photoresist, black printing ink, black resin or any other suitable light-shielding materials with various colors. The forming of the predetermined first light-shielding layer 110 may include a printing step, a coating step or any other suitable methods. For example, the black photoresist may be coated on the non-visible region 100B of the substrate 100, then the predetermined first light-shielding layer 110 is formed by exposure and development processes. Alternatively, the black printing ink may be printed on the substrate 100 to form the predetermined first light-shielding layer 110. This first light-shielding layer 110 can shield the subsequent signal lines formed over the substrate 100 and the light emitted by the subsequent light-emitting elements formed over the substrate 100. In the absence of the predetermined first light-shielding layer 110, the subsequent signal line would be problematically visible and the light emitted by the subsequent light-emitting elements would leak from the non-visible region 100B, resulting in a light-leakage issue.

Still referring to FIG. 2, the sensing electrode layer 120 is formed over the visible region 100A. The sensing electrode layer 120 may include, but is not limited to, single-layer electrode pattern structure or double-layer electrode pattern structure. These are skills known to those skilled in the art, and will not be repeated for the sake of brevity. In one embodiment of the present disclosure, the single-layer electrode pattern structure is taken for example. the sensing electrode layer 120 further extends to the non-visible region 100B and is disposed between the predetermined first light-shielding layer 110 and the subsequent predetermined wire layer 130. The material of the sensing electrode layer 120 may include, but is not limited to, transparent conductive materials, such as indium tin oxide (ITO), tin oxide (TO), indium zinc oxide (IZO), indium gallium zinc oxide (IGZO), indium tin zinc oxide (ITZO), antimony tin oxide (ATO), antimony zinc oxide (AZO), or any other suitable transparent conductive materials. The sensing electrode layer 120 may be formed by deposition processes accompanied with lithography and etching processes. The deposition processes may include, but are not limited to, sputtering, electroplating, resistance heating evaporation, electron beam evaporation or any other suitable deposition processes. The etching processes may include, but are not limited to, dry etching, wet etching or a combination thereof.

Still referring to FIG. 2, after forming the sensing electrode layer 120, the predetermined wire layer 130 is formed corresponding to the non-visible region 100B. The material of the predetermined wire layer 130 may include, but is not limited to, metal. The predetermined wire layer 130 may be formed by printing or deposition processes. The deposition processes may include, but is not limited to, sputtering, electroplating, resistance heating evaporation, electron beam evaporation or any other suitable deposition processes.

Figure 4:
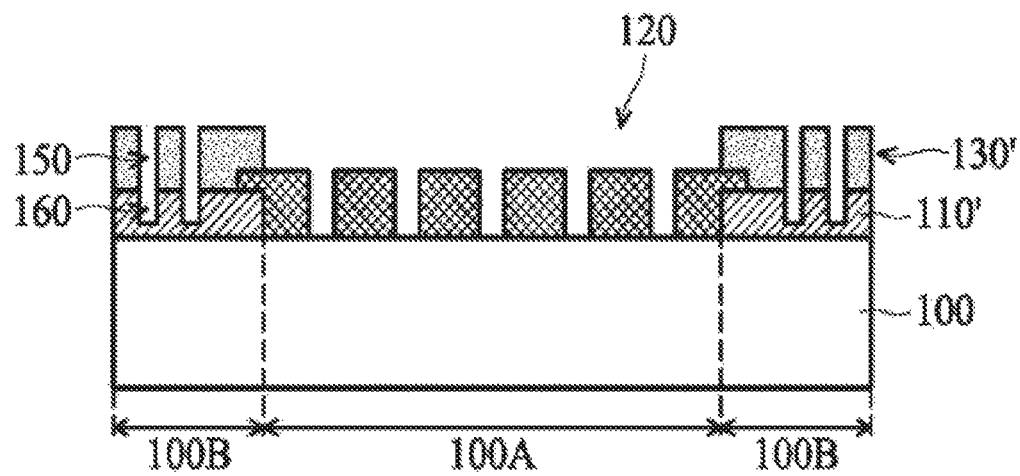

FIG. 3 illustrates the etching of the predetermined wire layer 130 to form a wire layer 130'. The wire layer 130' includes the signal lines 140 and the gap 150 therebetween, and the signal lines 140 electrically connect the sensing electrode layer 120. In some embodiments of the present disclosure, the signal lines 140 contact the portion of the sensing electrode layer 120 extending to the non-visible region 100B to result in electric connection. The signal lines 140 can transmit the electric signal generated from the sensing electrode layer 120 to the external sensing circuit, such that the touched position can be determined by the external sensing circuit. The wire layer 130' may be formed after the forming of the sensing electrode layer 120 and may cover the sensing electrode layer 120 over the non-visible region 100B. Note that the wire layer 130' may be formed before the forming of the sensing electrode layer 120, too. This will be described in the following and FIGS. 6-8D. The aforementioned etching processes may include, but is not limited to, a laser etching process, lithography and etching processes (such as dry etching) or any other suitable etching processes. The etching process etches the predetermined wire layer 130 to form a wire layer 130'. This etching process usually inevitably etches the predetermined first light-shielding layer 110 below the wire layer 130', such that the predetermined first light-shielding layer 110 is etched to form a first light-shielding layer 110' including at least one recess 160. The position of the recess 160 corresponds to the position of the gap 150. In some embodiments of the present disclosure, as illustrated in FIG. 3, the aforementioned etching process completely etches through the predetermined first light-shielding layer 110, therefore the recess 160 penetrates down to the substrate 100 and exposes a portion of the substrate 100. However, In other embodiments of the present disclosure, as illustrated in FIG. 4, the recess 160 penetrates partially through the first light-shielding layer 110'. In other words, the recess 160 does not completely penetrate through the predetermined first light-shielding layer 110, and there is a distance between the bottom of the recess 160 and the surface of the substrate 100.

As mentioned above, the first light-shielding layer 110' is used to shield the subsequent signal lines 140 formed over the substrate 100 and the light emitted by the subsequent light-emitting elements formed over the substrate 100. However, the etching process forming the signal lines 140 also forms recess 160 in the first light-shielding layer 110'. The light emitted by the subsequent light-emitting elements will leak form the recess 160 and result in a light-leakage issue in the non-visible region 100B. Therefore, the present disclosure forms a second light-shielding layer after the etching process to fill the recess 160 formed in the first light-shielding layer 130' by the etching process, which in turn solves the light-leakage issue at recess 160 in the non-visible region 100B and the exposure of the elements. For the sake of brevity, the configuration of the recess 160 illustrated in FIG. 3 is taken as an example to describe the subsequent step for forming the second light-shielding layer. However, those skilled in the art will appreciate that the process for forming the second light-shielding layer is also applicable in the configuration of the recess 160 illustrated in FIG. 4.

Referring to FIGS. 5A-5D, FIGS. 5A-5D are cross-sectional views of a touch panel of FIG. 3 or FIG. 4 in accordance with embodiments of the present disclosure. After forming the gap 150 and the recess 160, the second light-shielding layer 170 is formed to form the touch panel 200. The second light-shielding layer 170 is disposed at least corresponding to the recess 160, and the area covered by the second light-shielding layer 170 is equal to or greater than the aperture of the recess 160. The second light-shielding layer 170 is made of black photoresist, black printing ink, black resin or any other suitable light-shielding materials. The forming of the second light-shielding layer 170 may include, but is not limited to, a printing step, a coating step or any other suitable methods. For example, the black photoresist may be coated on the substrate 100, then the second light-shielding layer 170 is formed by exposure and development processes. Alternatively, the black printing ink may be printed over the recess 160 to form the second light-shielding layer 170. Note that when the second light-shielding layer 170 is described as "above the substrate 100", "over the substrate 100" or "on the substrate 100", it indicates not only the direct contact of the second light-shielding layer 170 and the substrate 100, but also a non-contact state of one or more laminated layers between the second light-shielding layer 170 and the substrate 100.

Figure 5A:
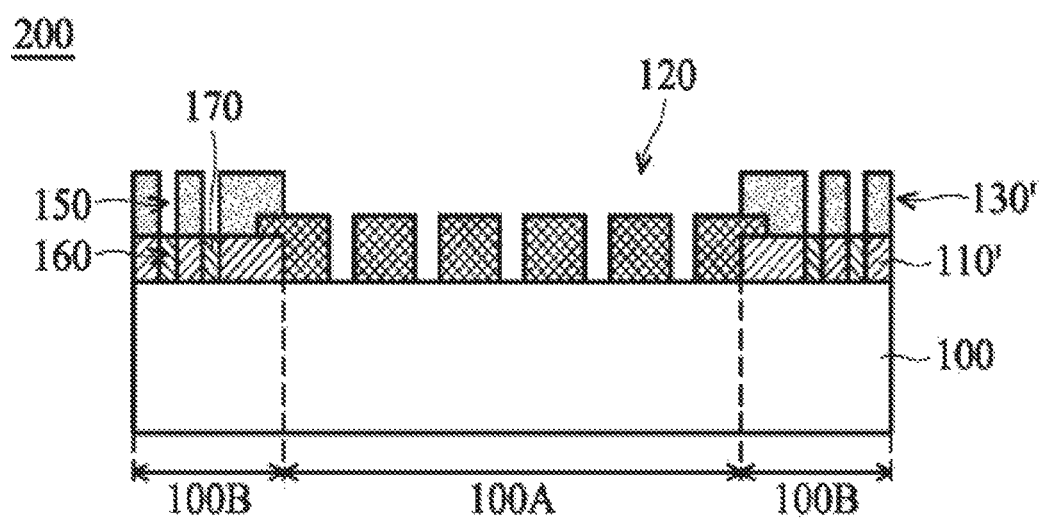
FIGS. 5A-5D are cross-sectional views of a touch panel of FIG. 3 in accordance with embodiments of the present disclosure.
Figure 5B:
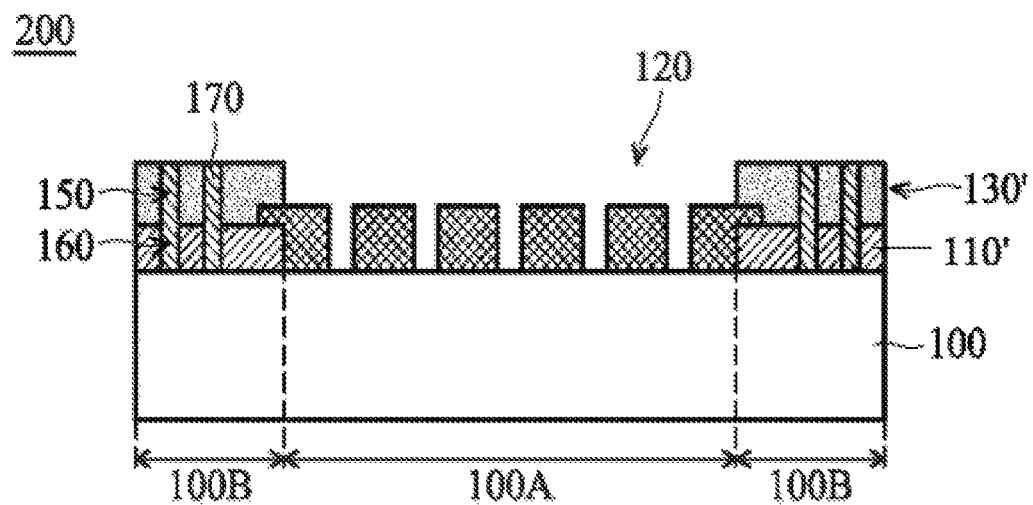
Figure 5C:
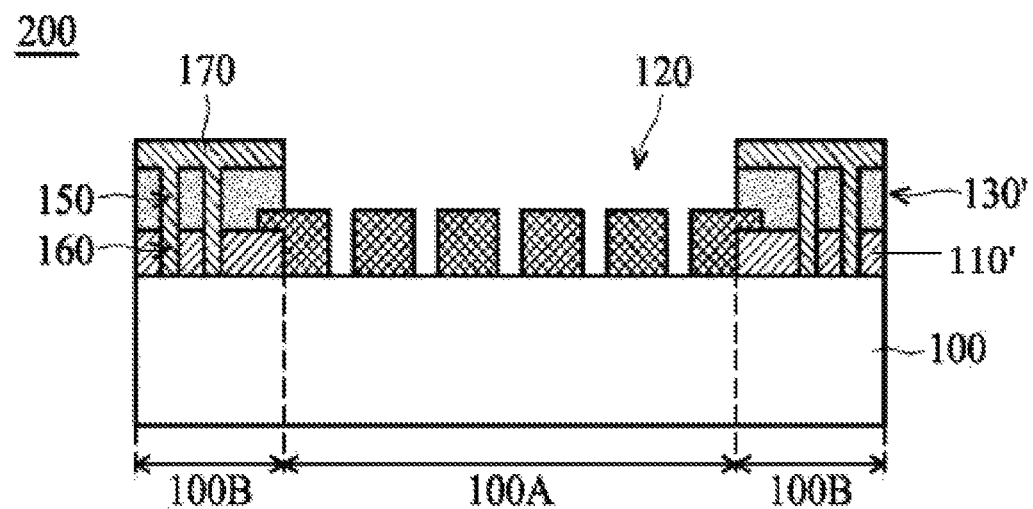
Figure 5D:
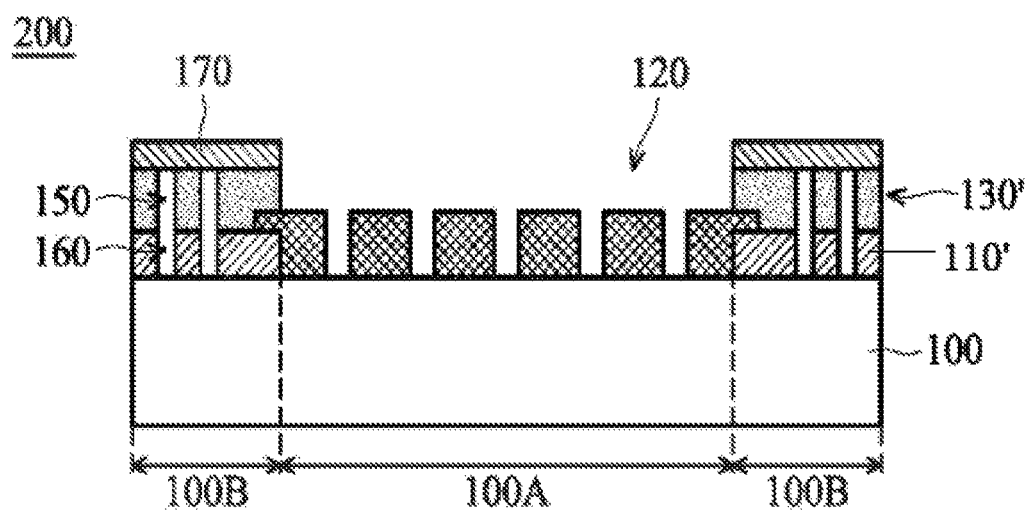

The second light-shielding layer 170 corresponds to or covers the recess 160 by various means. For example, as illustrated in FIG. 5A, the second light-shielding layer 170 may fill the recess 160. Alternatively, as illustrated in FIG. 5B, the second light-shielding layer 170 may completely fill the recess 160 and fill the gap 150. As another alternative, the second light-shielding layer 170 may completely fill the recess 160 and the gap 150 and overfill the gap 150 to extend onto the wire layer 130', as illustrated in FIG. 5C. Alternatively, as illustrated in FIG. 5D, the second light-shielding layer 170 may be disposed over the wire layer 130' but does not fill the recess 160 and the gap 150. Note that the second light-shielding layer 170 may cover the recess 160 by other configurations, and it should not be limited to those mentioned above.

As illustrated in FIGS. 5A-5D, the second light-shielding layer 170 fills or covers the recess 160, which in turn prevents the light emitted by the subsequent light-emitting elements from leakage from recess 160 or prevents the subsequent elements (such as the wire layer 130') from being problematically visible. Therefore, in the present disclosure, the second light-shielding layer 170 fills or covers the recess 160 to solve the aforementioned issues. The light-leakage issue occurred when the touch panel 200 combined with the display device (not shown).

Figure 6:
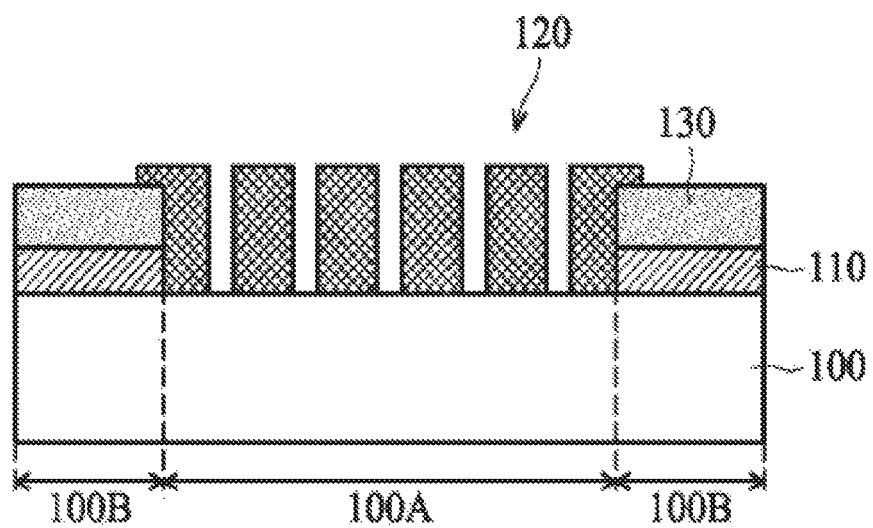
FIGS. 6-7 are cross-sectional views of a touch panel of FIG. 1 at various manufacturing stages in accordance with other embodiments of the present disclosure.
Figure 7:
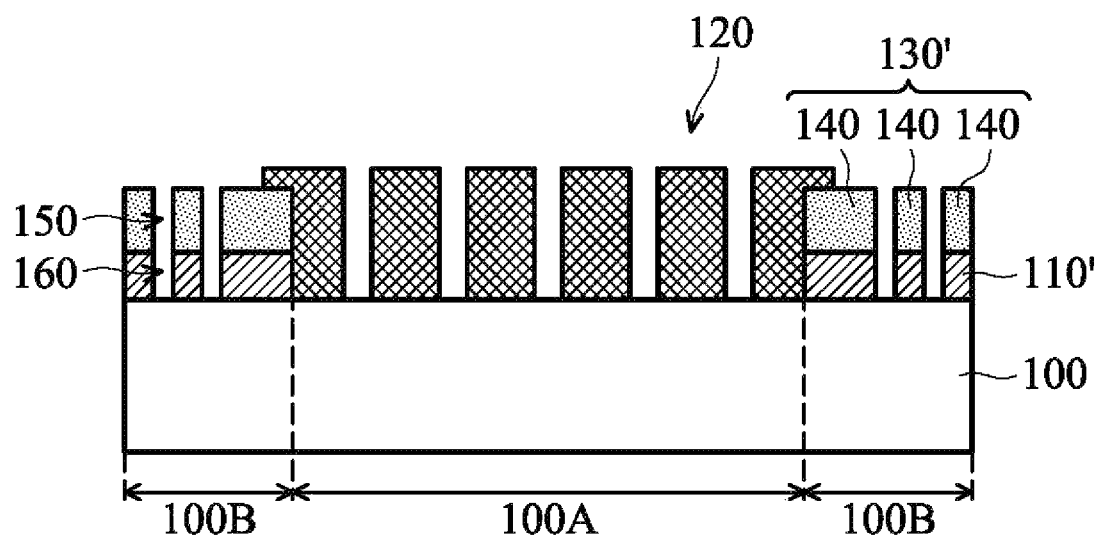

FIGS. 6-7 are cross-sectional views of a touch panel of FIG. 1 at various manufacturing stages in accordance with other embodiments of the present disclosure. Unlike forming the wire layer 130' after the sensing electrode layer 120 as illustrated in FIGS. 2-3, this embodiment forms the wire layer 130' before the forming of the sensing electrode layer 120. Note that the same or like elements or layers corresponding to those mentioned above are denoted to by like reference numerals. The same manufacturing processes, materials and functions will not be repeated for the sake of brevity.

Referring to FIG. 6, the predetermined first light-shielding layer 110, the predetermined wire layer 130 and the sensing electrode layer 120 are formed sequentially over the substrate 100. The sensing electrode layer 120 is formed after the forming of the predetermined wire layer 130. The sensing electrode layer 120 further extends into the non-visible region 100B and is disposed over the predetermined wire layer 130.

Next, referring to FIG. 7, etching the predetermined wire layer 130 to form a wire layer 130'. The wire layer 130' includes the signal lines 140 and the gap 150 therebetween, and the signal lines 140 electrically connect the sensing electrode layer 120. This etching process also etches the predetermined first light-shielding layer 110 to form a first light-shielding layer 110' that includes at least one recess 160. In some embodiments of the present disclosure, as illustrated in FIG. 7, the aforementioned etching process completely etches through the predetermined first light-shielding layer 110, therefore the recess 160 penetrates down to the substrate 100 and exposes a portion of the substrate 100. However, In other embodiments of the present disclosure, the recess 160 penetrates partially through the first light-shielding layer 110'. In other words, the recess 160 does not completely penetrate through the predetermined first light-shielding layer 110, and there is a distance between the bottom of the recess 160 and the surface of the substrate 100 (referring to FIG. 4).

Figure 8A:
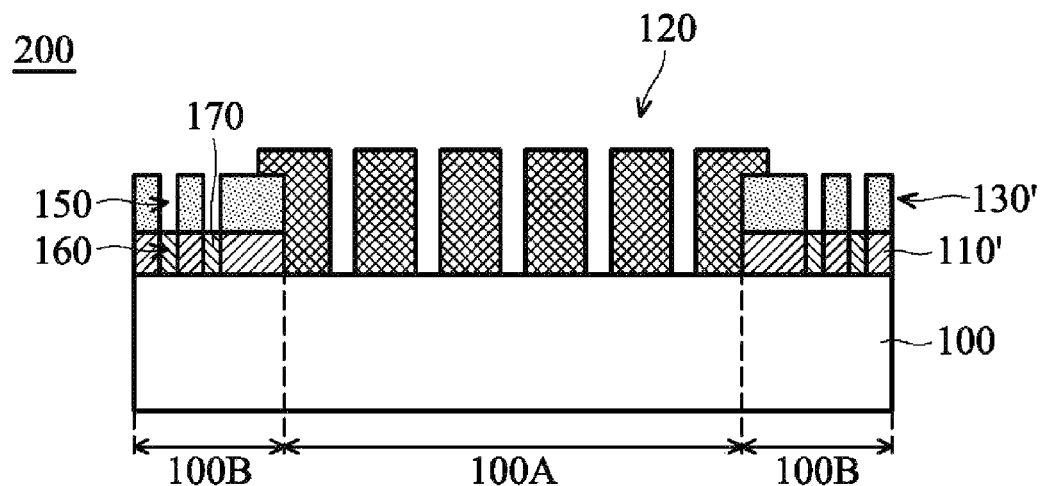
FIGS. 8A-8D are cross-sectional views of a touch panel corresponding to FIGS. 5A-5D in accordance with embodiments of the present disclosure.
Figure 8B:
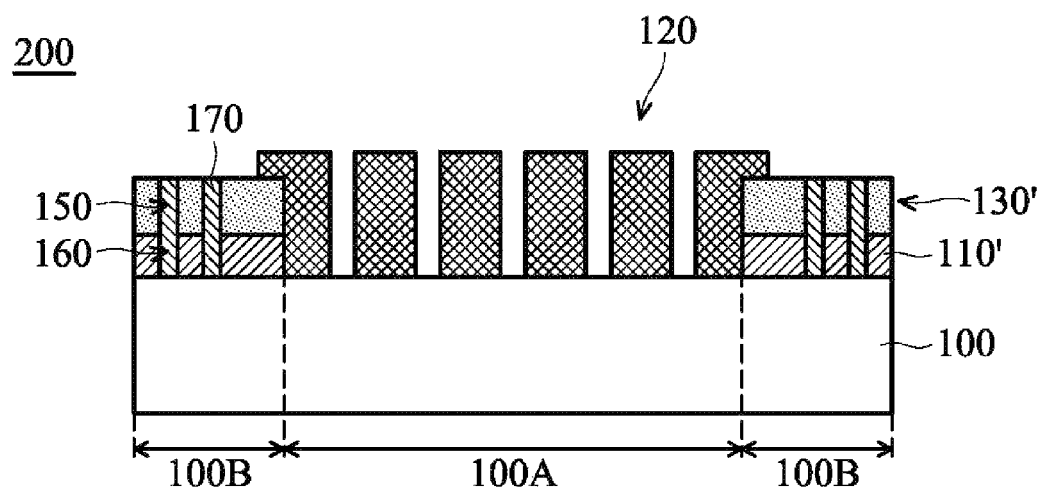
Figure 8C:
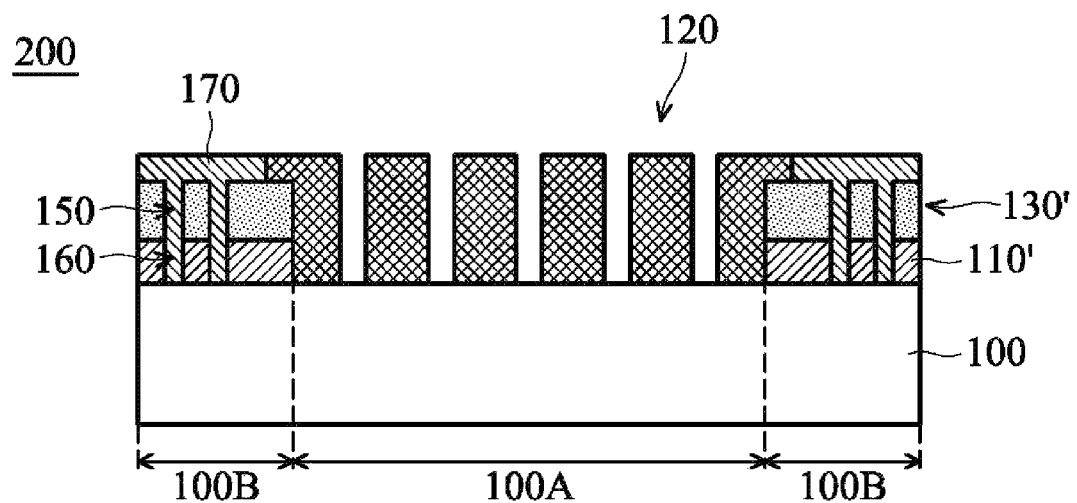
Figure 8D:
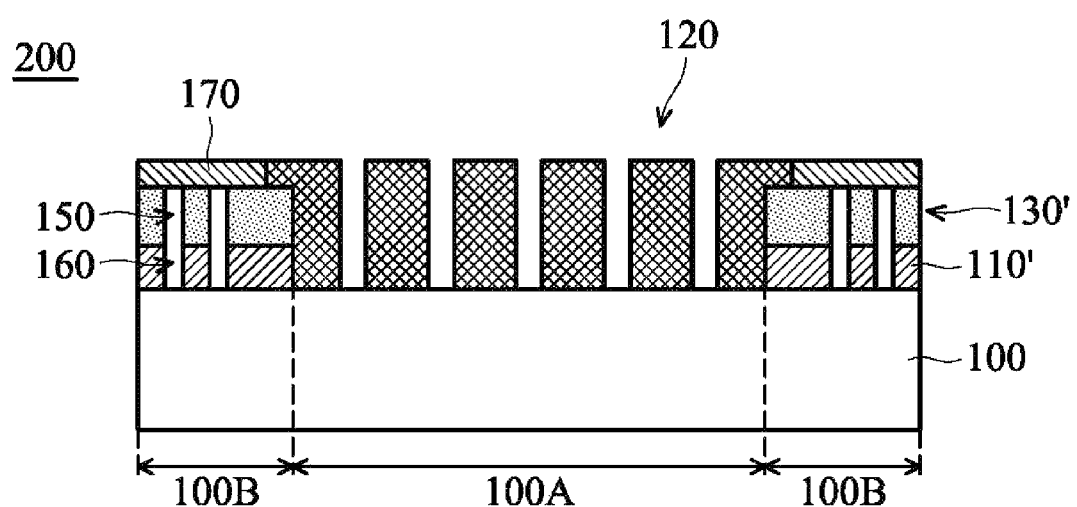

Next, referring to FIGS. 8A-8D, which are cross-sectional views of a touch panel corresponding to FIGS. 5A-5D in accordance with embodiments of the present disclosure. After forming the gap 150 and the recess 160, the second light-shielding layer 170 is formed to form the touch panel 200. The second light-shielding layer 170 is disposed at least corresponding to the recess 160, and the area covered by the second light-shielding layer 170 is equal to or greater than the aperture of the recess 160. The second light-shielding layer 170 may correspond or cover the recess 160 by various means. For example, as illustrated in FIG. 8A, the second light-shielding layer 170 may fill the recess 160. Alternatively, as illustrated in FIG. 8B, the second light-shielding layer 170 may completely fill the recess 160 and fill the gap 150. As another alternative, the second light-shielding layer 170 may completely fill the recess 160 and the gap 150 and overfill the gap 150 to extend onto the wire layer 130', as illustrated in FIG. 8C. Alternatively, as illustrated in FIG. 8D, the second light-shielding layer 170 may be disposed over the wire layer 130' but does not fill the recess 160 and the gap 150. Note that the second light-shielding layer 170 may cover the recess 160 by other configurations, and it should not be limited to those mentioned above.

In summary, the touch panel of the present disclosure may be formed by, but is not limited to, the manufacturing method in the aforementioned embodiments. The touch panel of the present disclosure includes the substrate 100, the sensing electrode layer 120, the wire layer 130', the first light-shielding layer 110' and the second light-shielding layer 170. The substrate 100 has the visible region 100A and the non-visible region 100B disposed at at least one side of the visible region 100A. The sensing electrode layer 120 is disposed over the visible region 100A. The wire layer 130' corresponds to the non-visible region 100B. The wire layer 130' includes signal lines 140 and at least one gap 150 therebetween, and the signal lines 140 electrically connect the sensing electrode layer 120. The first light-shielding layer 110' is disposed within the non-visible region 100B and between the substrate 100 and the wire layer 130'. The first light-shielding layer 110' includes at least one recess 160 and the position of the recess 160 corresponds to the position of the gap 150. The second light-shielding layer 170 corresponds to the recess 160, and the area covered by the second light-shielding layer 170 is equal to or greater than the aperture of the recess 160. Note that the same or like elements or layers corresponding to those mentioned above are denoted to by like reference numerals. The same manufacturing processes, materials and functions will not be repeated for the sake of brevity.

In summary, the method for manufacturing the touch panel provided in the present disclosure form a second light-shielding layer after the etching process to fill the recess formed in the first light-shielding layer in the etching process, which in turn can solve the issues of light leakage at the non-visible region and the exposure of the elements.

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method for manufacturing a touch panel, comprising:
   providing a substrate having a visible region and a non-visible region disposed at at least one side of the visible region;
   forming at least one sensing electrode layer in the visible region;
   forming a wire layer in the non-visible region;
   forming a first light-shielding layer in the non-visible region and between the substrate and the wire layer;
   etching the wire layer to form a plurality of signal lines and at least one gap therebetween, and wherein the signal lines electrically connect the sensing electrode layer, wherein the etching of the wire layer further comprises etching the first light-shielding layer to form at least one recess in the first light-shielding layer, wherein a position of the recess is aligned to a position of the gap; and
   forming a second light-shielding layer in the non-visible region, wherein an area covered by the second light-shielding layer is equal to or greater than an aperture of the recess.

2. The method for manufacturing the touch panel as claimed in claim 1, wherein the first light-shielding layer and the second light-shielding layer are made of black photoresist, black printing ink and black resin.

3. The method for manufacturing the touch panel as claimed in claim 1, wherein the second light-shielding layer fills the recess.

4. The method for manufacturing the touch panel as claimed in claim 1, wherein the second light-shielding layer completely fills the recess and fills the gap.

5. The method for manufacturing the touch panel as claimed in claim 1, wherein the second light-shielding layer completely fills the recess and the gap and overfills the gap to extend onto the wire layer.

6. The method for manufacturing the touch panel as claimed in claim 1, wherein the wire layer is formed after the forming of the sensing electrode layer, and the sensing electrode layer further extends to the non-visible region and is disposed between the wire layer and the first light-shielding layer.

7. The method for manufacturing the touch panel as claimed in claim 1, wherein the sensing electrode layer is formed after the forming of the wire layer, and the sensing electrode layer further extends to the non-visible region and is disposed over the wire layer.

8. The method for manufacturing the touch panel as claimed in claim 1, wherein the etching of the wire layer companies a laser etching step.

9. The method for manufacturing the touch panel as claimed in claim 1, wherein the forming of the second light-shielding layer companies a printing step or a coating step.

* * * * *